(12) United States Patent
Wu et al.

(10) Patent No.: US 7,749,911 B2
(45) Date of Patent: Jul. 6, 2010

(54) METHOD FOR FORMING AN IMPROVED T-SHAPED GATE STRUCTURE

(75) Inventors: Chung-Cheng Wu, Hsin-Chu (TW); Wen-Ting Chu, Kaohsiung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 50 days.

(21) Appl. No.: 11/001,514

(22) Filed: Nov. 30, 2004

(65) Prior Publication Data

US 2006/0115938 A1  Jun. 1, 2006

(51) Int. Cl.
*H01L 21/311* (2006.01)
(52) U.S. Cl. ............... 438/701; 438/300; 438/301; 438/514; 438/585; 438/700; 438/706; 438/713; 438/745; 438/778; 438/787
(58) Field of Classification Search ............ 438/229, 438/300, 301, 514, 585, 700, 701, 706, 713, 438/715, 745, 778, 787, 791, 959, 961, 978, 438/FOR. 388, FOR. 395, FOR. 401
See application file for complete search history.

(56) References Cited

U.S. PATENT DOCUMENTS

| | | | |
|---|---|---|---|
| 4,956,312 A * | 9/1990 | Van Laarhoven | 438/639 |
| 5,498,560 A * | 3/1996 | Sharma et al. | 438/261 |
| 6,051,506 A * | 4/2000 | Kim et al. | 438/718 |
| 6,271,128 B1 * | 8/2001 | Tseng | 438/638 |
| 6,271,563 B1 * | 8/2001 | Yu et al. | 257/344 |
| 6,355,556 B1 * | 3/2002 | Tseng | 438/638 |
| 6,424,021 B1 * | 7/2002 | Liu et al. | 257/649 |
| 6,897,120 B2 * | 5/2005 | Trapp | 438/424 |
| 7,008,832 B1 * | 3/2006 | Subramanian et al. | 438/182 |
| 2003/0151020 A1 * | 8/2003 | Lee et al. | 252/2 |
| 2004/0016995 A1 * | 1/2004 | Kuo et al. | 257/678 |
| 2004/0033657 A1 * | 2/2004 | Chuang et al. | 438/230 |
| 2004/0113212 A1 * | 6/2004 | Lee et al. | 257/408 |
| 2004/0203198 A1 * | 10/2004 | Cho et al. | 438/200 |

(Continued)

FOREIGN PATENT DOCUMENTS

TW          266313          12/1995

(Continued)

OTHER PUBLICATIONS

TW Office Action mailed Apr. 10, 2008.

(Continued)

*Primary Examiner*—N Drew Richards
*Assistant Examiner*—Joannie A Garcia
(74) *Attorney, Agent, or Firm*—Thomas, Kayden, Horstemeyer & Risley

(57) ABSTRACT

A T-shaped gate structure and method for forming the same the method including providing a semiconductor substrate comprising at least one overlying sacrificial layer; lithographically patterning a resist layer overlying the at least one sacrificial layer for etching an opening; forming the etched opening through a thickness of the at least one sacrificial layer to expose the semiconductor substrate, said etched opening comprising a tapered cross section having a wider upper portion compared to a bottom portion; and, backfilling the etched opening with a gate electrode material to form a gate structure.

20 Claims, 3 Drawing Sheets

U.S. PATENT DOCUMENTS

| | | | |
|---|---|---|---|
| 2004/0251793 A1* | 12/2004 | Matsuhisa | 310/365 |
| 2005/0020020 A1* | 1/2005 | Collaert et al. | 438/300 |
| 2005/0037547 A1* | 2/2005 | Bertin et al. | 438/142 |
| 2005/0105325 A1* | 5/2005 | Haneda et al. | 365/154 |
| 2005/0269644 A1* | 12/2005 | Brask et al. | 257/369 |
| 2006/0017533 A1* | 1/2006 | Jahnes et al. | 335/78 |
| 2006/0046401 A1* | 3/2006 | Kavalieros et al. | 438/283 |

FOREIGN PATENT DOCUMENTS

| | | |
|---|---|---|
| TW | 301061 | 12/1995 |
| TW | 457568 | 10/2001 |
| TW | 520532 | 2/2003 |

OTHER PUBLICATIONS

English abstract of TW266313.
English abstract of TW301061.
English abstract of TW520532.
English abstract of TW457568.

* cited by examiner

METHOD FOR FORMING AN IMPROVED T-SHAPED GATE STRUCTURE

FIELD OF THE INVENTION

This invention generally relates to submicron FET device fabrication and more particularly an improved T-shaped gate structure and method for forming the same.

BACKGROUND OF THE INVENTION

As field effect transistor (FET) devices are scaled down to have channel lengths in the submicron and deep submicron ranges, gate electrical characteristics become increasingly important for both high speed CMOS digital applications as well as high frequency RF applications. CMOS design consideration for high speed digital applications are usually determined by the pull up time and pull down time of each individual gate. Individual gates are associated with a delay time period for signal propagation in PMOS and NMOS gate electrodes. The delay time period, in turn, is inversely proportional to the drive current ($I_{drive}$). It is therefore clear that maximizing the drive current will increase the performance speed or Figure of Merit (FOM) of a CMOS device.

This is particularly true for ultra high speed devices such as RF devices, whereby the increase in sheet resistance of the gate electrode structure with decreasing gate structure size, can degrade device high speed performance.

The prior art has proposed various solutions to the problem of gate electrode resistance including widening the upper portion of the gate electrode to reduce an overall sheet resistance since resistance is inversely proportional to a cross sectional area of the gate electrode. For example T-shaped gate electrodes have been proposed whereby a damascene like process is used to backfill an opening defined in a dielectric layer followed by etching the upper portion of the gate electrode to a wider dimension. While this approach has proven effective for gate lengths of larger than about 0.13 microns, as gate lengths decrease to less than about 0.13 microns several problems arise with the prior art process of forming T-shaped gate electrodes.

For example, prior art processes involve at least two photolithographic patterning steps to form the T-shaped gate structure, such photolithographic processes having increasingly stringent process windows including increasingly precise alignment of photomasks with respect to one another. Misalignment of photomasks in the photolithographic patterning processes frequently causes misalignment of the top portion of the gate electrode with the bottom thinner portion that defines a gate length resulting in asymmetric upper portions of the gate electrode. Such asymmetry in turn causes improper alignment of source and drain regions thereby degrading device performance and reliability.

There is therefore a need in the deep sub-micron FET manufacturing art for an improved deep sub-micron FET gate structure and method of forming the same including T-shaped gate structures in order to improve device performance and reliability as well as device scalability.

It is therefore an object of the invention to provide an improved T-shaped gate structure and method of forming the same in order to improve device performance, reliability, and scalability in addition to overcoming other shortcomings in the prior art.

SUMMARY OF THE INVENTION

To achieve the foregoing and other objects, and in accordance with the purposes of the present invention, as embodied and broadly described herein, the present invention provides a T-shaped gate structure and method for forming the same.

In a first embodiment, the method includes providing a semiconductor substrate comprising at least one overlying sacrificial layer; lithographically patterning a resist layer overlying the at least one sacrificial layer for etching an opening; forming the etched opening through a thickness of the at least one sacrificial layer to expose the semiconductor substrate, said etched opening comprising a tapered cross section having a wider upper portion compared to a bottom portion; and, backfilling the etched opening with a gate electrode material to form a gate structure.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention including the FET gate electrode and method of forming the same is explained with reference to, and is particularly advantageously implemented in forming a T-shaped gate electrode having a gate length ($L_g$) of less than about 0.13 microns, it will be appreciated that the larger characteristic $L_g$ dimensions may be formed whereby a single photolithographic patterning and etching process is used to form the T-shaped gate electrode. A T-shaped gate electrode is generally defined as having a larger cross-sectional width in an upper portion compared to a lower portion overlying a channel region wherein portions of the gate electrode sidewalls are tapered.

In an exemplary embodiment of the present invention, reference is made to FIGS. 1A-1F where cross sectional views of portions of a process wafer are shown at stages of manufacture to form a MOSFET gate structure according to an embodiment of the present invention. For example, referring to FIG. 1A a semiconductor substrate 12 is provided. The semiconductor substrate 12, may include, but is not limited to, silicon, silicon on insulator (SOI), stacked SOI (SSOI), stacked SiGe on insulator (S—SiGeOI), SiGeOI, and GeOI, or combinations thereof.

Figure 1A:
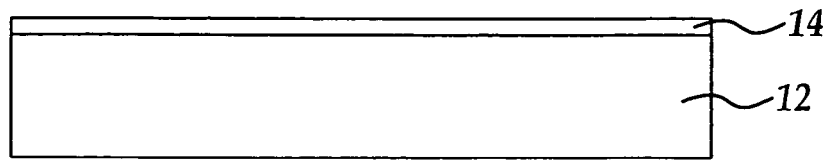
FIGS. 1A-1F are cross sectional views of a portion of a semiconductor substrate showing manufacturing stages to form a T-shaped gate structure according to an embodiment of the present invention.

Still referring to FIG. 1A, following conventional processes which may include forming doped well regions (not shown) in the substrate 12, and forming shallow trench isolation (STI) regions (not shown), a pad oxide layer 14 is formed over the semiconductor substrate surface to a thickness of about 50 Angstroms to about 200 Angstroms. The pad oxide layer (1$^{st}$ sacrificial layer) 14 may be formed by conventional thermal oxidation methods, CVD deposition, or chemical oxidation methods, more preferably thermal oxidation.

Figure 1B:
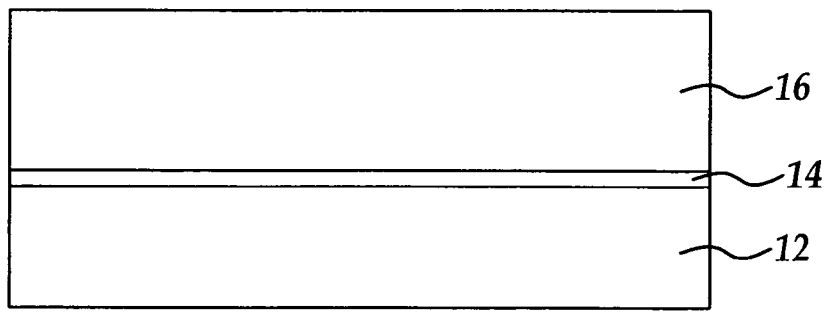

Referring to FIG. 1B, a nitride layer (2$d$ sacrificial layer) 16, preferably silicon nitride (e.g., $Si_3N_4$, SiN) is deposited by LPCVD or PECVD methods to a thickness about equal to the desired height of a gate structure, for example from about 1000 Angstroms to about 5000 Angstroms. It will be appreciated that the nitride layer 16 may be formed of silicon oxynitride or include an uppermost silicon oxynitride layer to act as an anti-reflective coating (ARC) in a subsequent lithographic (e.g., photolithographic) patterning process.

Figure 1C:
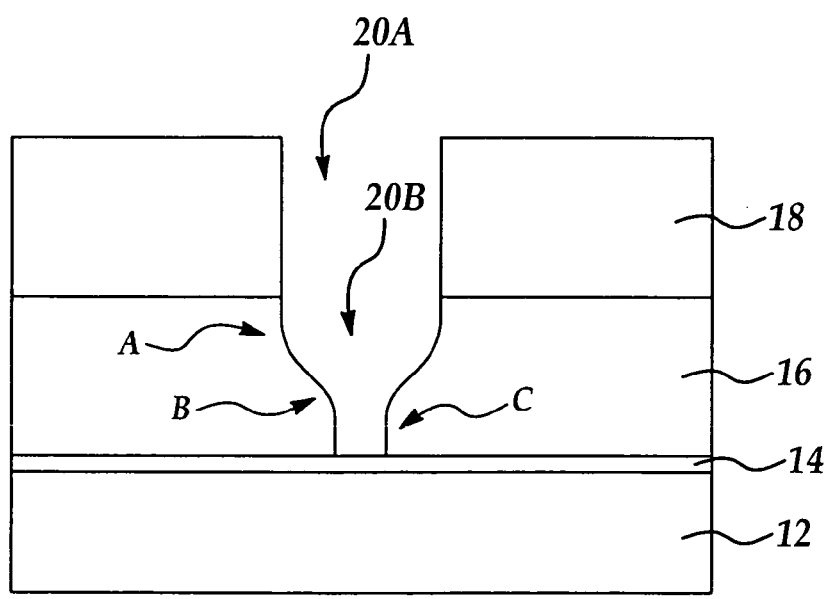

Referring to FIG. 1C, a photoresist layer 18 is deposited over the nitride layer 16 and patterned by a conventional lithographic process to form an opening 20A exposing a portion of the underlying nitride layer 16, for beginning the dry etching (e.g., reactive ion etch) process to form a T-shaped gate structure according to the present invention.

Still referring to FIG. 1C, in an important aspect of the invention following patterning of the resist layer 16 a hydrofluorocarbon etching chemistry, preferably having a fluorine to carbon ratio or greater than about 2.5, more preferably about 3 or greater is then used to etch through the nitride layer 16 to form opening 20B. In a preferred embodiment, the dry etching chemistry includes hexafluoroethane ($C_2F_6$) and argon, with optional addition of oxygen and/or nitrogen to control an etch rate. It will be appreciated that the dry etch chemistry is an important aspect of the invention, as the preferred hydrofluorocarbon etch chemistry allows the formation of a passivation polymer layer along the sidewalls (not shown) during etching at a preferred rate, thereby allowing the formation of a symmetrically tapered T-shaped gate structure such as opening 20B exemplified in FIG. 1C.

For example, as the dry etching process proceeds, the opening 20B is formed having substantially symmetrically tapered sidewalls that taper from an uppermost opening width to a progressively narrower width at a lower portion. By the term 'substantially symmetrical' is meant a symmetry formed by a single lithographic patterning and etch process as opposed to a symmetry that relies on the relative alignment of more than one lithographic and etching process, e.g., a variation in symmetry with respect to a symmetry center of less than about 5 percent, preferably less than about 2 percent. It will be appreciated that the angle of sidewall taper may vary through the thickness of the nitride layer 16, for example including a smaller angle of taper (e.g., smaller than 90 degrees at vertical) at an upper portion compared to a bottom portion. For example the upper portion is preferably formed in a cup or goblet shaped structure, for example to form a wine glass shape, which is included in the term T-shaped as used herein.

For example, as exemplified in FIG. 1C, a first portion, e.g., A, tapers (narrows) to a narrower cross sectional width at a first rate (taper angle) to about a level C, for example including a progressively smaller sidewall taper angle (with respect to vertical e.g., 90 degrees) e.g., to approximate the liquid holding portion of a wine glass. It will be appreciated that the rate of narrowing of the opening 20B may be varied by plasma etching conditions and an etching temperature. For example the upper wider portion of the opening e.g., A, may be formed to include about ¼ to about ¾ of the thickness of the nitride layer 16. A second narrower bottom portion e.g., B is then formed having sidewalls with a steeper (larger) angle of taper (closer to vertical e.g., 90 degrees) compared to the upper portion A, e.g., approximating the stem of a wine glass shape. For example, the lowermost opening 20B portion may be formed having an opening dimension (e.g., cross sectional width) to be from about ¼ to about ¾ as the uppermost opening dimension.

It will be appreciated that the term 'T-shape' or 'tapered T-shape' includes a wine glass shape as described above.

During etching, a polymer passivation layer (not shown) forms in-situ along the sidewalls of the first upper portion A, allowing the narrower bottom portion e.g., B to then be formed at a steeper taper angle and narrower width. In another important aspect of the invention, the process surface is cooled to a temperature of between about 0° C. to about 20° C., more preferably from about 0° C. to about 10° C., even more preferably from about 0° C. to about 5° C., the temperature having been found to aid the desired rate of formation of the polymer passivation layer in the upper portion at a desired rate to allow formation of a desired T-shaped etching profile.

Preferably, the dry etch process is carried out by a high density plasma (HDP), preferably formed by a transformer coupled plasma (TCP) source or inductively coupled plasma (ICP) source, also referred to as a dual source plasma (DSP. In an important aspect of the invention, the dry etching process is carried out at a pressure of about 1 mTorr to about 20 mTorr, more preferably between about 5 mTorr to about 15 mTorr. The RF power is applied from about 200 Watts to about 1000 Watts, and a bias power is optionally applied to the process wafer during at least a portion of the etching process, for example in etching the bottom narrower portion e.g., B, from about 50 Watts to about 300 Watts.

Figure 1D:
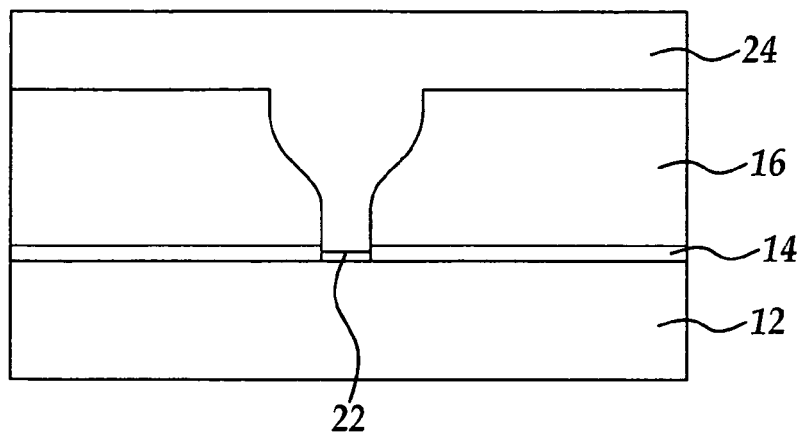

Referring to FIG. 1D, following etching through the nitride layer 16 and stripping the resist layer 18, a wet or dry, preferably a conventional dilute HF dip process, is carried out to remove the pad oxide layer 14 at the bottom of the gate opening to expose the substrate 12. The HF wet etching process is preferred to avoid plasma damage to the semiconductor substrate, but it will be appreciated that a plasma process such as a downstream plasma etching process may be carried out with a conventional dry etching chemistry such as HBr, and $Cl_2$ to minimize damage to the semiconductor substrate 12.

Still referring to FIG. 1D, following removal of the pad oxide layer 14 at the bottom of the opening 20B, a gate dielectric 22 is then formed over the substrate 12. For example, in a preferred embodiment the gate dielectric 22 is thermally grown silicon dioxide ($SiO_2$) grown by conventional methods, e.g. dry oxidation at a temperature of about 900° C. to about 1100° C. over a silicon substrate 12 at a thickness of about 5 Angstroms to about 20 Angstroms. It will be appreciated that the gate dielectric 22 may also include a nitridation process and may be formed by sputter deposition or chemical vapor deposition. The gate dielectric 22 may be formed of other materials such as silicon nitride, silicon oxynitride, and high-K (e.g., K>8) dielectrics. For example, the high-K dielectrics may include metal oxides, metal silicates, metal nitrides, transition metal-oxides, transition metal silicates, metal aluminates, and transition metal nitrides, or combinations thereof.

Still referring to FIG. 1D, following formation of the gate dielectric 22, a gate electrode material layer 24, preferably polysilicon is blanket deposited over the gate dielectric to fill the opening 20B including a portion overlying the process surface. For example, the polysilicon and may be formed in an amorphous or polycrystalline state, may be doped with other semiconductors such polysilicon-germanium, and may be formed including in-situ P or N doping. It will be appreciated that the gate electrode material layer may be formed of other materials including metals such as molybdenum, tungsten, titanium, tantalum, platinum, and hafnium or combinations thereof as well as oxides and nitride thereof.

Figure 1E:
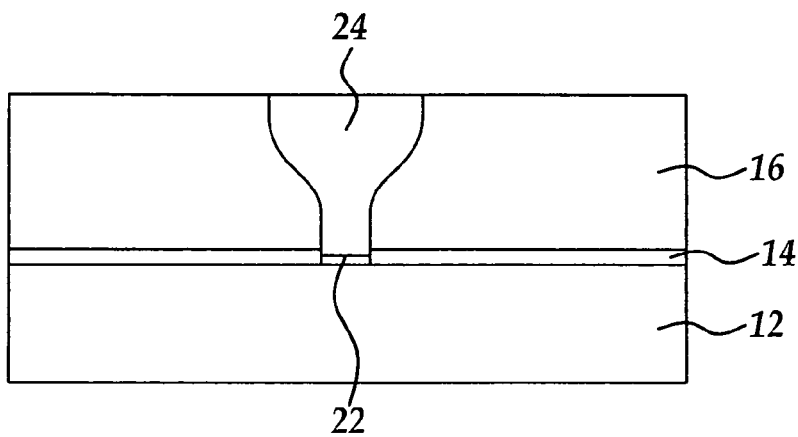

Referring to FIG. 1E, a conventional planarization process, preferably chemical mechanical polishing (CMP), is then carried out to remove the portion of the gate electrode material layer 24 overlying the nitride layer 16 above the filled opening level 20B to form a gate electrode portion.

Figure 1F:
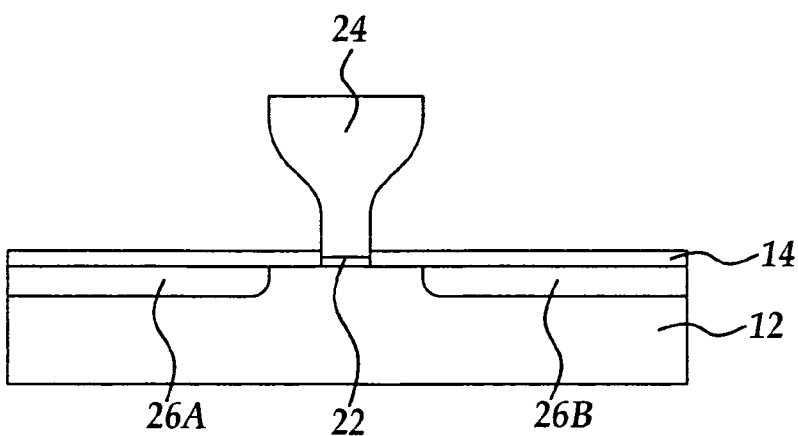

Referring to FIG. 1F, at least the nitride layer 16, and optionally the pad oxide layer 14 (sacrificial layers), are then removed by conventional wet etching processes e.g., $H_3PO_4$ dipping process to remove the oxide layer and a dilute HF dipping process to remove the pad oxide layer. Following sacrificial layer removal, a conventional source and drain ion implant process is then carried out to form source and drain regions e.g., 26A and 26B aligned with the upper outer edges of the gate electrode portion 24.

Subsequent conventional processes including removal of the pad oxide layer 14 followed by optional formation of oxide spacers adjacent the gate structure (not shown) as well as metal silicide formation e.g., $TiSi_2$, $CoSi_2$, or NiSi may then be carried out to form self aligned silicides (not shown) over the source and drain regions as well as the upper portion of the T-shaped (tapered) gate electrode portion 24.

A T-shaped gate structure and method for forming the same has been presented whereby a single lithographic and dry etching process is used to from a T-shaped gate structure, thereby reducing the number of process steps while avoiding the inherent problems of misalignment and asymmetry by two or more lithographic patterning processes. Advantageously, the single patterning and etching process according to preferred embodiments, forms a symmetric T-shaped gate structure, the upper wider portion being self aligned to source and drain regions formed in a subsequent ion implant process, thereby improving device performance and reliability. Moreover, the lithographic process has a larger lithographic process window compared to prior art processes making the method scalable to smaller device sizes.

Figure 2:
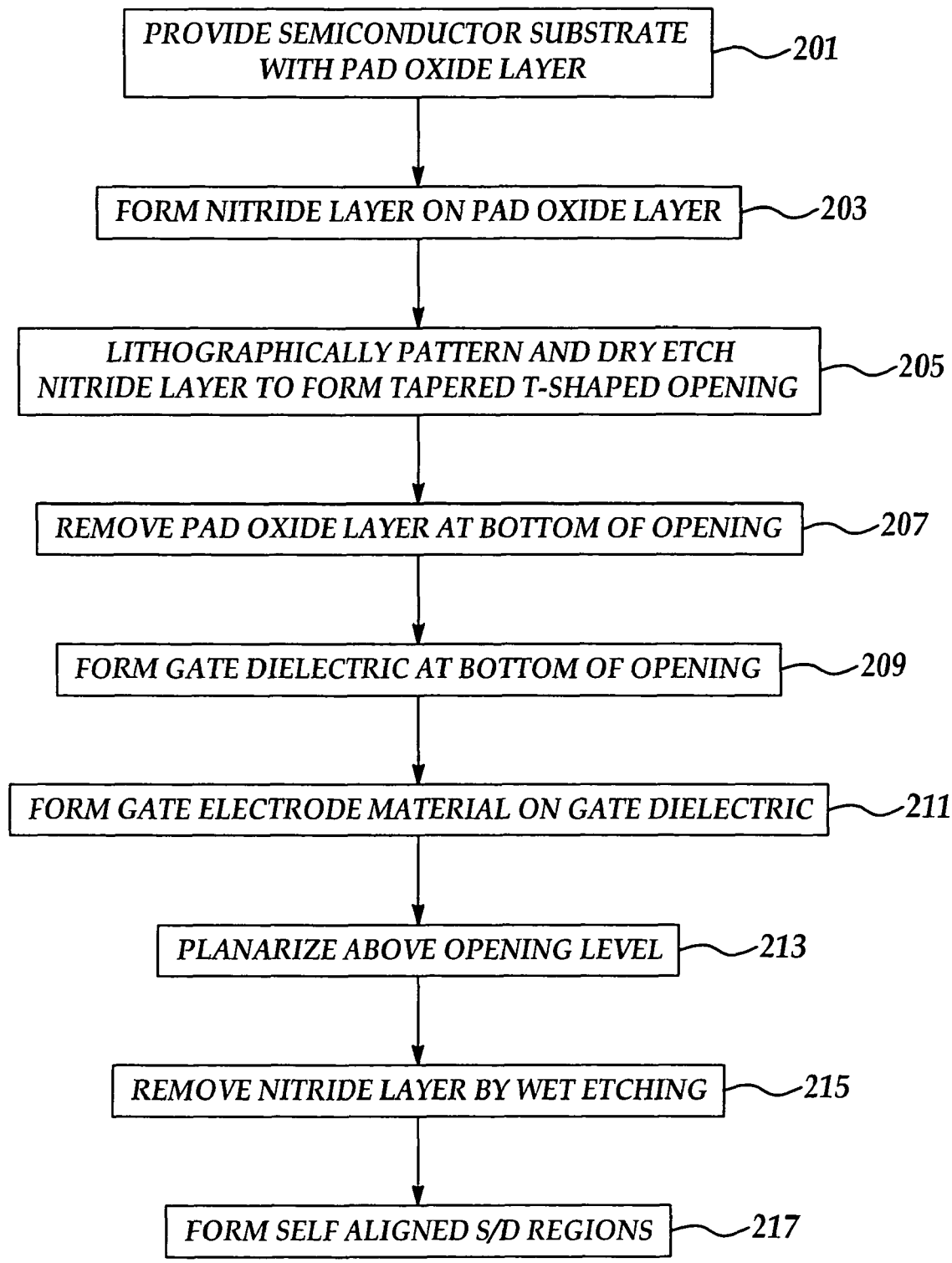
FIG. 2 is a process flow diagram including several embodiments of the present invention.

In FIG. 2 is shown a process flow diagram including several embodiments of the present invention. In process 201, a semiconductor substrate is provided with a pad oxide layer formed on the semiconductor substrate. In process 203, a nitride layer formed on the pad oxide. In process 205, the nitride layer is lithographically patterned and dry etched process according to preferred embodiments is carried out to form a tapered T-shaped etched opening. In process 207, the pad oxide layer portion at the bottom portion of the etched opening is removed to reveal the semiconductor substrate. In process 209, a gate dielectric is formed on the bottom portion. In process 211, a gate electrode material is blanket deposited to fill the etched opening. In process 213, a planarization process is carried out to remove gate electrode material above the nitride layer (opening level). In process 215, the nitride layer is removed. In process 217, self aligned source and drain regions are formed by an ion implant process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming a T-shaped gate structure comprising the steps of:
    providing a semiconductor substrate comprising at least one overlying sacrificial layer;
    etching the at least one sacrificial layer to form an opening therein using a separate photoresist layer as an etch mask, said opening having a wider upper portion compared to a bottom portion;
    backfilling the opening with a gate electrode material to form a gate structure having a T-shaped, wherein the at least one sacrificial layer comprises a silicon oxide layer on the semiconductor substrate and a nitride layer on the silicon oxide layer; and
    removing the at least one sacrificial layer to expose at least one portion of a sidewall of the gate structure after the step of backfilling.

2. The method of claim 1, wherein the step of backfilling comprises a CMP process to remove the gate electrode material overlying the at least one sacrificial layer.

3. The method of claim 1, further comprising a step of carrying out an ion implant process to form source and drain regions adjacent the gate structure substantially aligned with an uppermost portion of the gate structure.

4. The method of claim 1, wherein the nitride layer is selected from the group consisting of silicon nitride and silicon oxynitride.

5. The method of claim 1, wherein the step of forming the etched opening comprises a dry etching process to etch through the nitride layer.

6. The method of claim 1, wherein the step of forming the etched opening comprises a wet etching process to etch through the silicon oxide layer.

7. The method of claim 5, wherein the dry etching process comprises an etching chemistry with a fluorine to carbon ratio greater than about 2.5.

8. The method of claim 5, wherein the dry etching chemistry comprises hexafluoroethane ($C2F6$).

9. The method of claim 8, wherein the dry etching chemistry comprises argon.

10. The method of claim 5, wherein the dry etching process comprises cooling the process surface to between about 0° and about 20° C.

11. The method of claim 1, further comprising the step of forming a gate dielectric material at the bottom of the etched opening prior to the step of backfilling.

12. The method of claim 11, wherein the gate dielectric is thermally grown on the semiconductor substrate.

13. The method of claim 1, wherein the gate electrode material is selected from the group consisting of polysilicon, amorphous polysilicon, doped polysilicon and poly-silicon-germanium.

14. The method of claim 1, wherein the gate electrode material comprises a material selected from the group consisting of metals, metal oxides, and metal nitrides.

15. A method of forming a T-shaped gate structure comprising the steps of:
    providing a semiconductor substrate comprising an overlying silicon oxide layer and a nitride layer overlying the silicon oxide layer;
    lithographically patterning a resist layer overlying the nitride layer to form an opening therein;
    forming an etched opening to etch through a thickness of the nitride layer using the resist layer with the opening as an etch mask, said etched opening having a wider upper portion compared to a bottom portion;
    removing the silicon oxide layer to expose the semiconductor substrate; and
    backfilling the etched opening with a gate dielectric on the semiconductor substrate and a gate electrode material on the gate dielectric to form a gate electrode.

16. A method of forming a T-shaped gate structure comprising the steps of:
    providing a semiconductor substrate comprising at least one overlying sacrificial layer;
    etching the at least one sacrificial layer to form an opening therein using a separate photoresist layer as an etch mask, said opening having a wider upper portion compared to a bottom portion, wherein the upper portion of the opening comprises a first sidewall taper angle and a bottom portion of the opening comprises a second sidewall taper angle closer to being vertical compared to the first sidewall taper angle;

backfilling the opening with a gate electrode material to form a gate structure having a T-shaped, wherein the at least one sacrificial layer comprises a silicon oxide layer on the semiconductor substrate and a nitride layer on the silicon oxide layer; and removing the at least one sacrificial layer to expose at least one portion of a sidewall of the gate structure after the step of backfilling.

17. The method of claim 16, wherein the step of backfilling comprises a CMP process to remove the gate electrode material overlying the at least one sacrificial layer.

18. The method of claim 16, further comprising a step of carrying out an ion implant process to form source and drain regions adjacent the gate structure substantially aligned with an uppermost portion of the gate structure.

19. The method of claim 16, wherein the step of forming the etched opening comprises a dry etching process to etch through the nitride layer.

20. The method of claim 16, further comprising the step of forming a gate dielectric material at the bottom of the etched opening prior to the step of backfilling.

* * * * *